United States Patent [19]
Bedford et al.

[11] 3,983,496
[45] Sept. 28, 1976

[54] PULSE CIRCUITS

[75] Inventors: John Bedford, Gorebridge, Scotland; John Alexandre Sherrington, Camberley, England

[73] Assignee: Ferranti, Limited, Hollinwood, England

[22] Filed: Apr. 15, 1975

[21] Appl. No.: 568,200

[30] Foreign Application Priority Data
Apr. 16, 1974 United Kingdom............... 16609/74

[52] U.S. Cl............................ 328/110; 307/232; 307/235 T; 307/290; 307/247 R
[51] Int. Cl.² ........................................ H03K 5/20
[58] Field of Search................ 307/232, 247 A, 290, 307/235 T; 328/109, 110

[56] References Cited
UNITED STATES PATENTS

| | | | |
|---|---|---|---|
| 3,462,613 | 8/1969 | Wolf | 307/247 R |
| 3,515,998 | 6/1970 | Adams et al. | 307/247 R |
| 3,531,727 | 9/1970 | Hall | 307/247 R |
| 3,612,907 | 10/1971 | Braunholtz | 307/232 X |
| 3,887,823 | 6/1975 | Nikami | 307/290 X |

Primary Examiner—John S. Heyman
Attorney, Agent, or Firm—Cameron, Kerkam, Sutton, Stowell & Stowell

[57] ABSTRACT

A high-speed pulse detection circuit comprises a Schmitt trigger stage connected to a second stage to form a bistable feedback loop having a working characteristic with an infinite gain loop.

13 Claims, 4 Drawing Figures a)

b)

PULSE CIRCUITS

This invention relates to pulse circuits, and in particular to circuits for the detection of high-speed pulses.

One of the commonest pulse detection circuits is the "Eccles-Jordan" bistable circuit, which is arranged to change from one to the other of its two stable states on the application of an input signal. The change in the output of the circuit indicates that such a change of state has occurred, and the bistable circuit is then reset to its original state. This type of pulse detector is commonly used in asynchronous digital systems where it is necessary to determine the relative timings of two signals from different sources. In this situation the width of the detected pulse is directly related to the relative timings of the two asynchronous signals.

The disadvantage of using such a bistable circuit is that the pulse causing it to change state must be longer than a certain critical duration in order to change the state of the circuit. A pulse which is too short may either not change the state of the circuit at all, or may leave it in an indeterminate state from which it takes a relatively long time to recover. Hence the common Eccles-Jordan bistable circuit is not altogether satisfactory for the detection of pulses at high speed.

It is an object of the invention to provide a circuit which is suitable for the high-speed detection of pulses.

According to the present invention there is provided a high-speed pulse detection circuit which includes a Schmitt trigger stage having a transfer characteristic with an infinite gain region, and a second stage connected to the first stage so as to form a bistable feedback loop having a working characteristic with an infinate gain loop.

The invention will now be described with reference to the accompanying drawings, in which.

Figure 1:
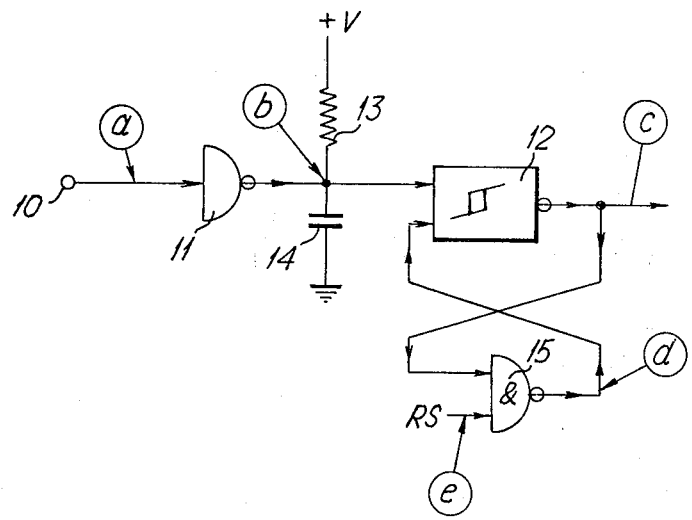
FIG. 1 is a logic diagram of a pulse detector circuit.

Referring now to FIG. 1, the input terminal 10 of the circuit is connected to the input of an open-collector TTL gate 11. The output of the gate is connected to one input of a first stage in the form of a Schmitt trigger circuit 12, and to a resistor-capacitor network as shown. The resistor 13 is connected to a potential +V and the capacitor 14 to earth potential. The output of the Schmitt trigger circuit is connected to one input of a second stage in the form of an inverter gate 15 which in turn has its output connected to the other input of the Schmitt trigger circuit. A reset signal RS may be applied to the other input of the inverter gate 15.

Figure 2:
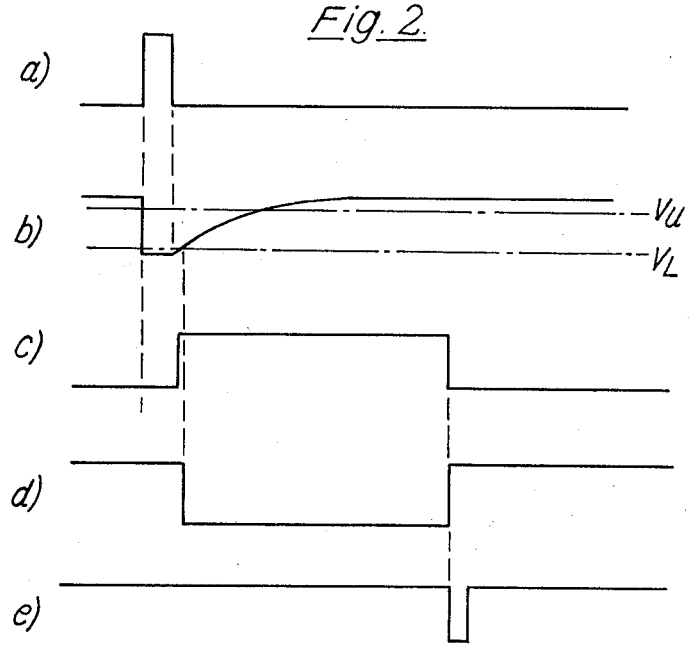
FIG. 2 illustrates the operation of the circuit of FIG. 1.

The operation of the circuit of FIG. 1 will now be described with reference also to FIG. 2.

FIG. 2a shows an input pulse such as may be applied to the input terminal 10. The effect of the open-collector gate 11 and the RC network 13–14 is to delay the trailing edge of this pulse. When the pulse is applied the capacitor 14 discharges, and when the pulse is terminated the capacitor charges relatively showly through the resistor 13. Hence the pulse appearing at the input of the Schmitt trigger circuit has the form shown in FIG. 2b. The Schmitt trigger circuit 12 has two threshold levels, and these levels, $V_U$ and $V_L$, are arranged to lie between the limits of the pulse shown in FIG. 2b. The leading edge of this pulse falls below the lower threshold level $V_L$, and hence causes the Schmitt trigger circuit to change state, as shown in FIG. 2c, after a delay $t$ equal to the propagation delay of the circuit. The pulse of FIG. 2b rises slowly towards the upper threshold level $V_U$, but before this is reached the output of the Schmitt trigger circuit is propagated through the inverter gate 15 and maintains the input to the Schmitt trigger circuit below this upper threshold level. FIG. 2d shows the state of the second input to the Schmitt trigger circuit 12. At some later time a reset pulse RS changes the state of the input to the Schmitt trigger circuit (FIG. 2e) and allows it to return to its original state.

The pulse stretching arrangement of gate 11 and the RC network 13–14 is necessary where short pulses are expected to be applied to the input terminal 10. The Schmitt trigger circuit is particularly suitable because, unlike the Eccles-Jordan type of bistable circuit it reacts at a predictable speed for any triggering signal pulse width. The purpose of the pulse-stretching arrangement is to allow sufficient time for the change of the bistable circuit.

Figure 3:
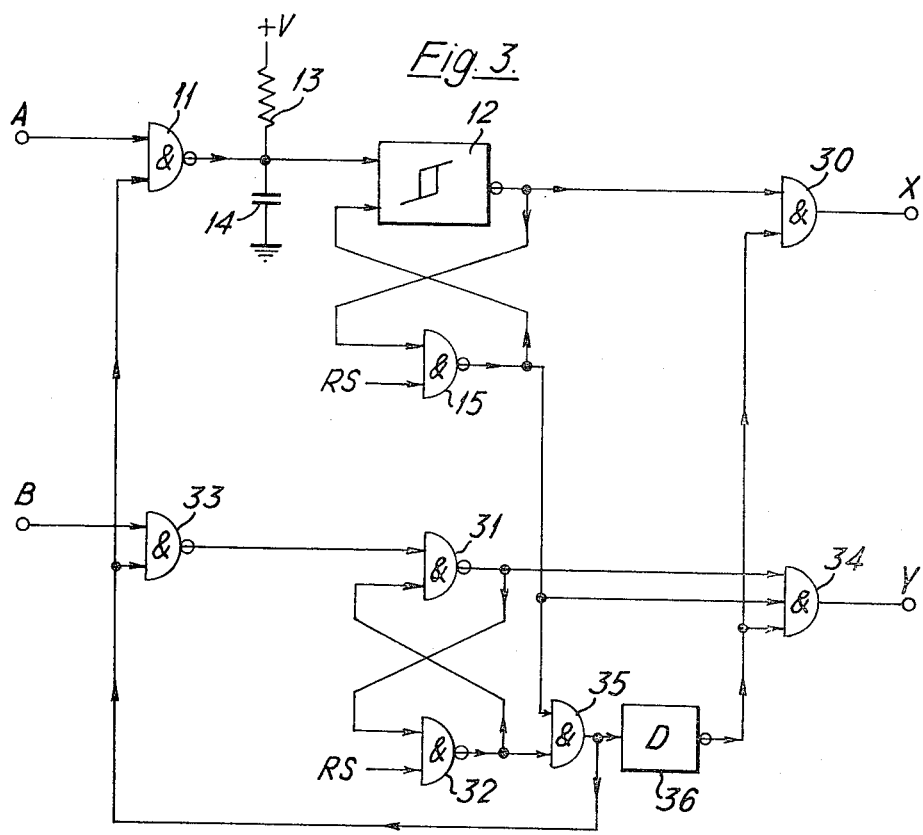
FIG. 3 illustrates an application of the circuit of FIG. 1.
Figure 4:
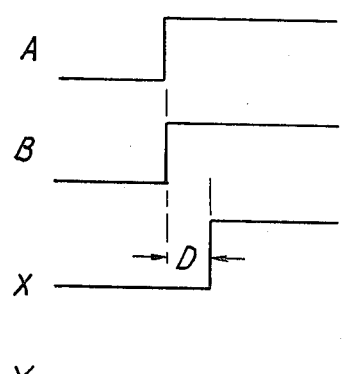
FIG. 4 shows waveforms occuring during the operation of the circuit of FIG. 3.
Figure 4:
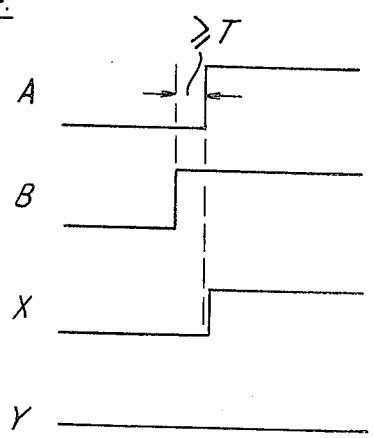

FIGS. 3 and 4 illustrate an application of the circuit described above, in the form of an asynchronous priority interface.

The interface has two input terminals A and B. To terminal A is connected a circuit of the type described above. The output of the Schmitt trigger circuit 12 is connected via a two-input AND gate 30 to an output terminal X. The other input terminal B is connected to a conventional bistable circuit made up of two cross-coupled NAND gates 31 and 32 to one of which the input terminal B is connected via a NAND gate 33. The output of gate 31 is connected via AND gate 34 to output terminal Y. The output of gate 15 is connected to one input of each of gates 34 and 35, whilst the output of gate 32 forms a second input to gate 35. The output of gate 35 is connected to inputs of gates 11 and 33, and to the input of a delay circuit 34. The inverted output of delay circuit 36 is connected to inputs of gates 30 and 34. The delay of delay circuit 36 is equal to the propagation delay of the circuit comprising gate 11, Schmitt trigger circuit 12, and gate 15.

The operation of the circuit of FIG. 3 will now be described with reference to FIG. 4. Input signals appear at input A and B in a purely random manner, and the function of the priority circuit is to ensure that the signal applied to input A is given priority over that applied to input B.

In the quiescent state, with no inputs present and the two cross-connected circuits reset, then the inputs to gate 35 ensure that gates 11 and 33 are primed, ready to pass an input signal. At the same time output gates 30 and 34, are blocked by the lack of an output from the delay circuit 36.

If an input signal is now applied to input A, the Schmitt trigger circuit 12 changes stage, and is held by the change in the output from gate 15. This results in the removal of one input to gate 35, and hence the output from this gate disappears, removing the priming input from gates 11 and 33. At the same time the input of the delay circuit 36 changes, so that after the appropriate delay gate 30 is opened to give an output signal at terminal X. The priority circuit is protected against the application of any further input signals until a reset signal RS is applied to gate 15.

The effect of applying an input signal to terminal B only is similar, the output now appearing at terminal Y.

FIG. 4a illustrates the case where the two input signals occur simultaneously. If both of the bistable circuits react at the same speed, then the outputs of gates 15 and 32 will change together. The change on the output of gate 15 blocks gate 34 so that even when an output appears from the delay circuit D some time later, gate 34 will not pass a signal to output terminal Y. On the other hand, gate 30 is opened and an output signal will appear on terminal X. As before, the input gates 11 and 33 are closed to prevent response to further input signals, and remain blocked until the two bistable circuits are reset. The delay in the appearance of a signal at output terminal X, as shown in FIG. 4a is the time delay D imposed by the delay circuit.

FIG. 4b shows the case where an input signal is applied to terminal B shortly before one is applied to terminal A. The initial response is as if only the first input signal exists, in that the bistable circuit comprising gates 31 and 32 changes state. Hence of the three inputs of gate 34, that from gate 31 changes state. The absence of an output from the delay circuit prevents gate 34 from opening to pass the signal to output terminal Y. The change of state of gate 32 also removes one input to gate 35. However a finite time T is taken from the application of the input signal to terminal B to the blocking of the two input gates 11 and 33. If an input signal is applied to terminal A within this time T, then the Schmitt trigger circuit 12 will be triggered. Gate 34 will then be blocked by the removal of the output from gate 15, so that the input signal applied to terminal A will still be given priority over that applied to terminal B. Any signal applied to terminal A after the time T will be blocked by gate 11.

If a priority circuit of the type described above has more than two inputs, then the number of pulse circuits including a Schmitt trigger stage increases. Since the operation of a priority circuit depends upon comparing every input with every other input the number of pulse circuits required having a Schmitt trigger stage is $(n - 1)!$ when $n$ is the number of pulse inputs. Hence a priority circuit having four pulse inputs requires 3 such pulse circuits, each including a Schmitt trigger stage.

What we claim is:

1. A high-speed pulse detection circuit comprising an input terminal to which a pulse may be applied, input means connected to the input terminal for providing a short discharge time when a pulse is applied to the input terminal and a long charge time when the pulse is terminated, a Schmitt trigger stage having a first and a second input and an output, said first input being connected to said input means, a second stage having a reset input, an input connected to said output of the Schmitt trigger stage and an output connected to said second input of the Schmitt trigger stage, and means connected to the output of the Schmitt trigger stage, the Schmitt trigger stage and the second stage forming a bistable loop which is set to one stable state by the application of a pulse to the input terminal of a duration sufficient to provide a voltage at said first input equal to a first threshold level of the Schmitt trigger stage, and is reset to the other stable state on the application of a pulse to the reset input of the second stage which allows the input of the Schmitt trigger stage to reach a second threshold level.

2. A circuit as claimed in claim 1 in which the second stage is a gate operable to maintain the voltage level of the input of the first input of the Schmitt trigger stage below its second threshold level.

3. A circuit as claimed in claim 1 wherein said input means for providing said short discharge time and said long charge time includes a gate connected to the input terminal and a resistance-capacitance connected between the output of the gate and the first input, said input means being operable to ensure that the duration of an input pulse is extended to ensure operation of the high speed pulse detection circuit.

4. A high speed priority circuit comprising at least one first input terminal to which a first pulse signal may be applied, at least one other input terminal to which other pulse signals may be applied and means for ensuring that said first pulse signal is given priority over said other pulse signals, said means including input means connected to the first input terminal for providing a short discharge time when a pulse is applied to said first input terminal and a long charge time when the pulse is terminated, a Schmitt trigger stage having a first and a second input and an output, said first input being connected to said input means, a second stage having a reset input, an input connected to said output of the Schmitt trigger stage and an output connected to said second input of the Schmitt trigger stage, and output means connected to the output of the Schmitt trigger stage, the Schmitt trigger stage and the second stage forming a bistable loop which is set to one stable state by the application of a pulse to the input terminal of a duration sufficient to provide a voltage at said one input equal to a first threshold level of the Schmitt trigger stage, and is reset to the other stable state on the application of a pulse to the reset input of the second stage which allows the input of the Schmitt trigger stage to reach a second threshold level.

5. A priority circuit as claimed in claim 4 wherein said means for providing said short discharge time and said long charge time includes a gate connected to the input terminal and a resistance-capacitance circuit connected between the output of the gate and the first input, said input means being operable to ensure that the duration of an input pulse is extended to ensure operation of the circuit, said second stage being operable to maintain the input of the Schmitt trigger stage at a voltage below its second threshold level and said means for ensuring priority further includes at least one other bistable loop having an input connected to said other input terminal and an output connected to a second output terminal and gate means connected between the output of the first and the other bistable loop and said second output terminal for gating the output thereto in accordance with the priority of said first and said second pulse signals.

6. A high speed priority circuit as set forth in claim 4 wherein said high speed detection circuit further includes input signal transfer means connected to each said second input terminal for passing said other pulse signal and being operably connected to said high speed detection circuit such that every first input signal at said first terminal is compared with every other input signal.

7. A high speed priority circuit as set forth in claim 4 comprising a plurality of inputs and including $n-1$ of said pulse detection circuits, where $n$ is the number of pulse inputs, for comparing every input to said priority circuit with every other input.

8. A high speed pulse detection circuit comprising an input terminal to which a pulse may be applied, means for delaying the trailing edge of any such pulse including a serially connected resistor and a capacitor connected between a voltage source and ground, the junction of said resistor capacitor being connected to the input terminal, said means providing a short discharge time when a pulse is applied to the input terminal and a long charge time when the pulse is terminated, a Schmitt trigger stage having a first and a second input, said first input being connected to the junction of the resistor and capacitor, a second stage having a reset input, an input connected to the output of the Schmitt trigger stage and an output connected to said second input of the Schmitt trigger stage, and an output terminal connected to the output of the Schmitt trigger stage, the Schmitt trigger stage and the second stage forming a bistable loop which is set to one stable state by the application of a pulse to the input terminal of a duration sufficient to discharge the capacitor to a voltage equal to a first threshold level of the Schmitt trigger stage, and is reset to the other stable state on the application of a pulse to the reset input of the second stage which allows the input of the Schmitt trigger stage to reach a second threshold level.

9. A circuit as claimed in claim 8 in which the second stage is a gate operable to maintain the level of the voltage applied to the first input of the Schmitt trigger stage at a voltage below its second threshold level.

10. A circuit as claimed in claim 8 which includes a gate connected to the input terminal and having an output connected to junction of the resistor-capacitor and operable to extend the duration of an input pulse to ensure operation of the circuit.

11. A high speed priority circuit comprising at least one first input terminal to which a first pulse signal may be applied, at least one second terminal to which other pulse signals may be applied, and means for ensuring that said first input signal is given priority over the other input signals, said means including at least one high speed detection circuit connected to said first input terminal, said high speed detection circuit including a resistance-capacitance circuit connected to the first input terminal and arranged to have a short discharge time when said first pulse is terminated, a Schmitt trigger stage having a first and a second input and an output, said first input being connected to the resistance-capacitance circuit, a second stage having a reset input, an input connected to the output of the Schmitt trigger stage and an output connected to said second input of the Schmitt trigger stage, and an output terminal connected to the output of the Schmitt trigger stage, the Schmitt trigger stage and the second stage forming a bistable loop which is set to one stable state upon the application of a pulse to the first input terminal of a duration sufficient to discharge the capacitor of the resistance-capacitance circuit to a voltage equal to a first threshold level of the Schmitt trigger stage, and is reset to the other stable state on the application of a pulse to the reset input of the second stage which allows the input of the Schmitt trigger stage to reach a second threshold level.

12. A circuit as claimed in claim 11 in which the second stage is a gate operable to maintain the input of the Schmitt trigger stage at a voltage below its second threshold level.

13. A circuit as claimed in claim 11 wherein said resistance-capacitance circuit includes a gate connected between said first input terminal and the junction of a serially connected resistor capacitor and being operable to extend the duration of an input pulse to ensure operation of the circuit.

* * * * *